United States Patent [19]

Harada et al.

[11] Patent Number: 4,496,435

[45] Date of Patent: Jan. 29, 1985

[54] METHOD OF MANUFACTURING THIN FILM CIRCUITS

[75] Inventors: Keiji Harada; Akio Sato, both of Tokyo, Japan

[73] Assignee: NEC Corporation, Tokyo, Japan

[21] Appl. No.: 577,821

[22] Filed: Feb. 7, 1984

[30] Foreign Application Priority Data

Feb. 8, 1983 [JP] Japan .................................. 58-19217

[51] Int. Cl.³ ........................................... H01C 17/00
[52] U.S. Cl. .................... 204/15; 204/38 A; 427/79; 427/102; 427/103; 427/96; 427/123; 427/126.3; 427/383.3; 156/656
[58] Field of Search ................... 427/79, 81, 101, 102, 427/103, 96, 123, 126.3, 383.3; 204/15, 38 A; 156/656

[56] References Cited

U.S. PATENT DOCUMENTS 3,607,679  9/1971  Melroy ............................. 204/38 A
4,251,326  2/1981  Arcidiacono et al. ........... 204/38 A

OTHER PUBLICATIONS

"Integrated Tantalum Film RC Circuits" by W. H. Orr et al., Proceedings, 1970, 20th Electronic Components Conference, pp. 602-612, particularly, FIG. 6.

Primary Examiner—Norman Morgenstern
Assistant Examiner—Richard Bueker
Attorney, Agent, or Firm—Burns, Doane, Swecker and Mathis

[57] ABSTRACT

A thin film circuit including resistor elements and capacitor elements is prepared by forming a tantalum film for capacitor on an insulating substrate, forming a tantalum film for resistor over the substrate, covering a predetermined region of the tantalum resistor film with a titanium film, heat treating a resulting assembly, removing the titanium film, and then covering the predetermined region with a metal film to provide ohmic contact therebetween.

11 Claims, 21 Drawing Figures

METHOD OF MANUFACTURING THIN FILM CIRCUITS

BACKGROUND OF THE INVENTION

This invention relates to a method of manufacturing a thin film circuit, especially, a thin film RC (resistor/capacitor) circuit.

In recent years, to meet requirements for various circuit performances, a thin film circuit having capacitor elements and resistor elements formed on the same substrate has been widely used and successive steps involved in a usual method of manufacturing such a thin film circuit are shown at steps (a) through (j) in FIG. 1.

As shown at (a) in FIG. 1, a tantalum film 2 for capacitor is first formed by sputtering, for example, to a thickness of about 5000 Å on a clean insulating substrate 1 made of glass, ceramic, alumina/ceramic or the like. After forming a capacitor pattern as shown at (b) in FIG. 1, a portion of the capacitor pattern is subjected to anodization to convert that portion into a dielectric layer 3 as shown at (c) in FIG. 1.

After that, a tantalum nitride film 4 is deposited on the entire surface of the substrate to a thickness of about 800 Å as shown at (d) in FIG. 1 and thereafter a metal film 5 made up of three layers of titatium, palladium and gold respectively having thicknesses of about 200 Å, 2000 Å and 8000 Å is vapor deposited on the film 4 as shown at (e) in FIG. 1. Thereafter, the metal film 5 is etched to form a first conductor pattern as shown at (f) in FIG. 1 and then the tantalum nitride film 4 is patterned to form a resistor as shown at (g) in FIG. 1. The entire resistor is subjected to stabilizing heat treatment. Then a metal film 6 comprising two layers of nichrome and gold respectively having thicknesses of 500 Å and 3000 Å is vapor deposited to cover the stabilized resistor and the first conductor pattern as shown at (h) in FIG. 1. Then the metal film 6 is patterned by etching to form a second metal conductor pattern, thus forming a capacitor element and a resistor element on the same substrate as shown at (i) in FIG. 1. Finally, the resistor is trimmed through laser trimming process. A plan view as seen from above at (i) is illustrated at (j) in FIG. 1.

Such a prior art method is seen in "Integrated Tantalum Film RC Circuits" by W. H. Orr et al, PROCEEDINGS, 1970, 20th ELECTRONIC COMPONENTS CONFERENCE, PP602-612, particularly, FIG. 6. In this method, after completion of the resistance stabilizing heat treatment, the second metal conductor pattern is formed to provide an opposing electrode of the capacitor and connection between internal conductor patterns. However, to provide the internal connection pattern, a portion of the second metal conductor pattern is superposed on a portion of the first metal conductor pattern, resulting in a problem of step coverage.

This is caused by the fact that the thickness of the second metal conductor pattern covering the stepped portion of the first metal conductor pattern becomes extremely small owing to the shadow effect at the time of vapor deposition. This causes disconnection of conductor in the circuit during fabrication or operation of the circuit. This decreases the yield of the thin film circuit as well as the reliability thereof.

To prevent such disconnection, a method has been proposed in which the thickness of the second metal conductor pattern is increased for suppressing the step coverage. However, when the thickness of the second metal film is increased, the probability of local deposition of a teardrop like metal particle lump on the opposing electrodes of the capacitor at the time of vapor deposition would increase, thus not only decreasing the yield of satisfactory capacitors but also making it difficult to miniaturize the thin film circuit.

SUMMARY OF THE INVENTION

It is an object of this invention to provide a method of manufacturing a thin film circuit capable of eliminating the defects described above and economically producing a highly reliable thin film circuit.

Briefly stated, according to the method of this invention, a predetermined region of a tantalum film for resistor formed on a substrate is temporarily covered by a titanium film, the assembly is heat treated, the titanium film is removed, and then the predetermined region is covered with metal film to provide ohmic contact therebetween.

According to one embodiment of this invention, a predetermined region of a tantalum film for resistor is covered with a titanium film, a portion of a resistor not covered with the titanium film is heat treated, the titanium film is removed, and all metal conductor patterns are simultaneously formed with a single step. Consequently, in the resulting thin film circuit, the interconnection between the first and second conductor patterns as required in the prior art method can be dispensed with and an ohmic contact between the tantalum resistor film in the predetermined region and the metal conductor pattern can be obtained.

In addition to titanium, as the heat treatment protective metal film utilized in this invention can be considered such metal materials as nichrome, chromium and aluminum which has good adhesion to the tantalum resistor film. However, where nichrome or chromium is used, when a film thereof is removed after the stabilizing heat treatment, the tantalum resistor film surface is often oxidized by an etchant. As a result, such a metal material prevents highly reliable reproducibility of ohmic electrical connection and is not practical. Where aluminum is used, the surface of the substrate made of alumina/ceramic, for example, is corroded by an etchant for aluminum thereby imparing firm adhesion between the tantalum film for capacitor and the substrate, which makes it difficult to establish the external connection pattern.

Where titanium is used, all these difficulties can be eliminated so that titanium is the most suitable for formation of a heat oxidation preventing film. In addition, titanium film once adhered is easy to remove by a suitable etchant and titanium material is inexpensive.

According to a preferred embodiment of this invention, there is provided a method of manufacturing a thin film circuit including capacitor elements and resistor elements which are formed on the same insulating substrate, the method comprising the steps of forming a tantalum film for capacitor on the insulating substrate; etching the tantalum capacitor film to form a predetermined circuit pattern; anodizing a portion of the tantalum capacitor film to convert the portion into an dielectric layer of the capacitor; forming a tantalum film for resistor on the entire surface of the substrate; forming a titanium film on the tantalum resistor film; patterning the titanium film to remove a portion thereof except portions at which conductor patterns and external lead conductors are formed; patterning the tantalum resistor film to form the resistor element; removing a portion of the tantalum resistor film overlying the dielectric layer; treating the resistor element for stabilizing the same; etching off the titanium film; forming a metal film comprising three layers of nichrome, palladium and gold on the entire substrate; and patterning the metal film to form terminals or conductor patterns of the resistor and capacitor elements.

DESCRIPTION OF THE PREFERRED EMBODIMENT

A preferred embodiment of this invention will now be described with reference to FIG. 2.

Figure 2:
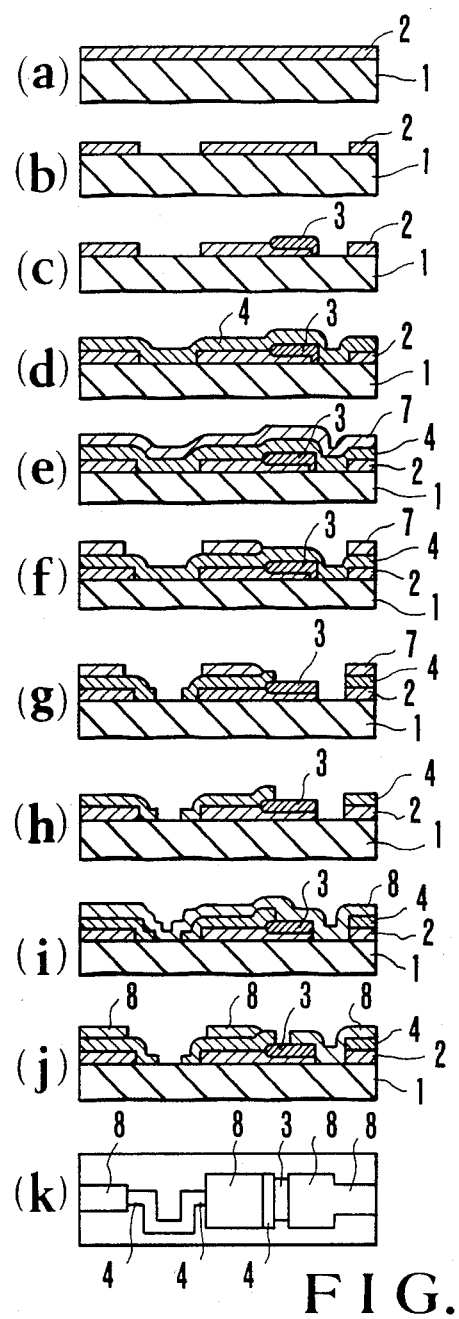
FIG. 2 shows successive steps of a method of manufacturing a thin film circuit according to this invention.

As shown at step (a) in FIG. 2, a tantalum film 2 for capacitor having a thickness of about 5000 Å is first formed by sputtering in a clear insulating substrate 1 made of glass, ceramic, alumina/ceramic or the like. Then, the tantalum capacitor film 2 is etched to form a desired circuit pattern as shown at step (b) in FIG. 2.

Then a portion of the tantalum capacitor film 2 is anodized to convert the portion into a dielectric layer 3 made of tantalum oxide which is used as capactor dielectric, as shown at (c) in FIG. 2.

Then as shown at (d) in FIG. 2, a tantalum film 4 for resistor having a thickness of about 800 Å is formed on the entire surface of the substrate by sputtering. Tantalum nitride, oxygen doped tantalum nitride or the like material may be used for the tantalum capacitor film 2.

After that, as shown at (e) in FIG. 2, a titanium film 7 having a thickness of about 700 Å is deposited on the tantalum resistor film 4 and then the titanium film 7 is patterned to remove a portion thereof except portions at which conductor patterns and external lead connectors are formed as shown at (f) in FIG. 2. Furthermore, the tantalum resistor film 4 is also patterned to form a resistor and a portion of the tantalum resistor film 4 overlying the dielectric layer 3 is removed as shown at (g) in FIG. 2. The resistor element is then heat treated in air for 5 hours at 250° C. for stabilization.

Following the heat treatment, the titanium film 7 is removed by using a sulfuric acid etchant as shown at (h) in FIG. 2. Thereafter, a metal film 8 comprising three layers of nichrome, palladium and gold respectively having thicknesses of 500 Å, 2000 Å and 6000 Å is formed by vapor deposition, as shown at (i) in FIG. 2.

Then, the metal film 8 is patterned to form terminals or terminal patterns of the resistor and capacitor elements to obtain a thin film circuit shown at (j) in FIG. 2. Thus, the metal film 8 makes ohmic contact to a predetermined region of the tantalum resistor film.

Figure 1:
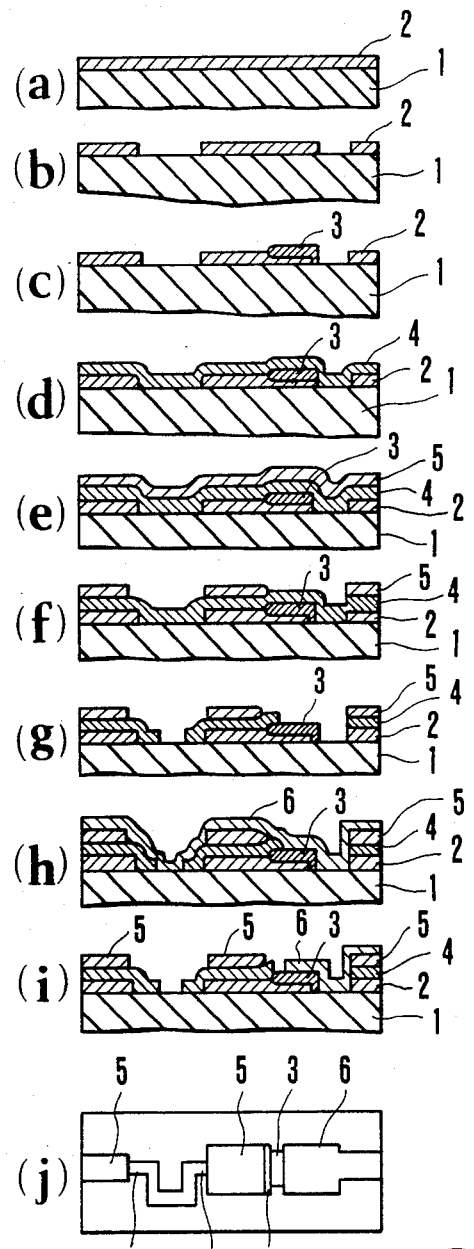
FIG. 1 shows successsive steps of a typical prior art method of manufacturing a thin film circuit.

A plan view as seen from above at (j) is illustrated at (k) in FIG. 1.

As described above, according to the method of this invention, the metal conductor patterns and terminals which have been formed in two steps according to the prior art method are formed simultaneously in one step so that the problem regarding the internal conductor pattern caused by step coverage can be completely obviated. The method of this invention can be used for preparing a thin film circuit requiring stabilizing heat treatment. The thin film circuit manufactured by the method of this invention is electrically stable.

What is claimed is:

1. A method of manufacturing a thin film circuit comprising the steps of:
    forming a tantalum film on insulating substrate;
    covering a predetermined region of said tantalum film with a titanium film;
    heat treating a resulting assembly;
    removing said titanium film; and
    covering said predetermined region with a metal film to provide ohmic contact therebetween.

2. The method according to claim 1 wherein said metal film comprises nichrome, palladium and gold layers.

3. A method of forming a thin film circuit including capacitor elements and resistor elements which are formed on the same insulating substrate, comprising the steps of:
    forming a tantalum film for capacitor on said insulating substrate;
    etching said tantalum capacitor film to form a predetermined circuit pattern;
    anodizing a portion of said tantalum capacitor film to convert said portion into a dielectric layer of said capacitor;
    forming a tantalum film for resistor on the entire surface of said substrate;
    forming a titanium film on said tantalum resistor film;
    patterning said titanium film to remove a portion thereof except portions at which conductor patterns and external lead terminal connectors are formed;
    patterning said tantalum resistor film to form the resistor element;
    removing a portion of said tantalum resistor film overlying said dielectric layer;
    heat treating said resistor element for stabilizing the same;
    etching off said titanium film;
    forming a metal film on the entire substrate; and
    patterning said metal film to form terminals or conductor patterns of said resistor and capacitor elements.

4. The method according to claim 3 wherein said tantalum resistor film is a tantalum nitride film.

5. The method according to claim 3 wherein said tantalum resistor film is an oxygen doped tanalum nitride film.

6. The method according to claim 3 wherein said metal film comprises nichrome, palladium and gold layers.

7. The method according to claim 3 wherein said tantalum capacitor film has a thickness of about 5000 Å.

8. The method according to claim 3 wherein said tantalum resistor film has a thickness of about 800 Å.

9. The method according to claim 3 wherein said titanium film has a thickness of about 700 Å.

10. The method according to claim 3 wherein said resistor element is heat treated in air for 5 hours at 50° C.

11. The method according to claim 3 wherein said three layers of nichrome, palladium and gold respectively have thicknesses of about 500 Å, 2000 Å and 6000 Å.

* * * * *